US012635160B2

(12) United States Patent
Shen et al.

(10) Patent No.: US 12,635,160 B2
(45) Date of Patent: May 19, 2026

(54) SEMICONDUCTOR DEVICE STRUCTURE

(71) Applicant: Taiwan Semiconductor Manufacturing Company, Ltd., Hsinchu (TW)

(72) Inventors: Hsiang-Ku Shen, Hsinchu City (TW); Jin-Mu Yin, Kaohsiung City (TW); Tsung-Chieh Hsiao, Shetou Township, Changhua County (TW); Chia-Lin Chuang, Taoyuan City (TW); Li-Zhen Yu, New Taipei City (TW); Dian-Hau Chen, Hsinchu (TW); Shih-Wei Wang, Hsinchu (TW); De-Wei Yu, Ping-tung (TW); Chien-Hao Chen, Chuangwei Township, Ilan County (TW); Bo-Cyuan Lu, New Taipei City (TW); Jr-Hung Li, Zhubei City (TW); Chi-On Chui, Hsinchu City (TW); Min-Hsiu Hung, Tainan City (TW); Hung-Yi Huang, Hsin-chu City (TW); Chun-Cheng Chou, Taichung City (TW); Ying-Liang Chuang, Zhubei City (TW); Yen-Chun Huang, New Taipei City (TW); Chih-Tang Peng, Zhubei City (TW); Cheng-Po Chau, Tainan City (TW); Yen-Ming Chen, Zhubei City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 639 days.

(21) Appl. No.: 17/875,098

(22) Filed: Jul. 27, 2022

(65) Prior Publication Data

US 2022/0376079 A1 Nov. 24, 2022

Related U.S. Application Data

(62) Division of application No. 15/797,973, filed on Oct. 30, 2017, now Pat. No. 11,444,173.

(51) Int. Cl.
H10D 30/01 (2025.01)
H01L 21/3065 (2006.01)
(Continued)

(52) U.S. Cl.
CPC ..... H10D 30/0212 (2025.01); H01L 21/3065 (2013.01); H01L 21/31111 (2013.01);
(Continued)

(58) Field of Classification Search
CPC .. H10D 30/0212; H10D 30/024; H10D 30/62; H10D 30/6211; H10D 30/6219;
(Continued)

(56) References Cited

U.S. PATENT DOCUMENTS 6,271,122 B1 8/2001 Wieczorek et al.
8,796,666 B1 8/2014 Huang et al.
(Continued)

*Primary Examiner* — Jay C Kim
*Assistant Examiner* — John Lin
(74) *Attorney, Agent, or Firm* — Birch, Stewart, Kolasch & Birch, LLP

(57) ABSTRACT

A semiconductor device structure is provided. The semiconductor device structure includes a fin spacer alongside a fin structure, a source/drain structure over the fin structure, and a salicide layer along a surface of the source/drain structure. A bottom portion of the salicide layer is in contact with the fin spacer. The semiconductor device structure also includes a capping layer over the salicide layer. A portion of the capping layer directly below the bottom portion of the salicide layer is in contact with the fin spacer. The semiconductor device structure also includes a dielectric layer over the capping layer. The dielectric layer is made of a different material than the capping layer.

20 Claims, 17 Drawing Sheets

(51) Int. Cl.

| | |
|---|---|
| *H01L 21/311* | (2006.01) |
| *H01L 21/768* | (2006.01) |
| *H10D 30/62* | (2025.01) |
| *H10D 64/01* | (2025.01) |
| *H10D 64/62* | (2025.01) |
| *H10D 84/01* | (2025.01) |
| *H10D 84/03* | (2025.01) |
| *H10D 84/83* | (2025.01) |
| *H10D 30/69* | (2025.01) |
| *H10D 62/13* | (2025.01) |
| *H10D 62/822* | (2025.01) |

(52) U.S. Cl.
CPC .. *H01L 21/76805* (2013.01); *H01L 21/76877* (2013.01); *H10D 30/024* (2025.01); *H10D 30/6211* (2025.01); *H10D 64/021* (2025.01); *H10D 64/62* (2025.01); *H10D 84/0133* (2025.01); *H10D 84/0135* (2025.01); *H10D 84/0149* (2025.01); *H10D 84/0158* (2025.01); *H10D 84/038* (2025.01); *H10D 84/834* (2025.01); *H10D 30/797* (2025.01); *H10D 62/151* (2025.01); *H10D 62/822* (2025.01); *H10D 64/017* (2025.01)

(58) Field of Classification Search
CPC ............. H10D 84/0158; H10D 84/834; H10D 84/853; H10D 86/011; H10D 86/215; H10D 64/021; H10D 64/62; H10D 62/151; H10B 12/056
See application file for complete search history.

(56) References Cited

U.S. PATENT DOCUMENTS

| | | | |
|---|---|---|---|
| 8,815,712 B2 | 8/2014 | Wan et al. | |
| 8,963,258 B2 | 2/2015 | Yu et al. | |
| 9,093,530 B2 | 7/2015 | Huang et al. | |
| 9,171,929 B2 | 10/2015 | Lee et al. | |
| 9,214,555 B2 | 12/2015 | Oxland et al. | |
| 9,236,267 B2 | 1/2016 | De et al. | |
| 9,520,482 B1 | 12/2016 | Chang et al. | |
| 9,548,303 B2 | 1/2017 | Lee et al. | |
| 9,564,369 B1 * | 2/2017 | Kim ................. | H01L 21/32134 |
| 9,576,814 B2 | 2/2017 | Wu et al. | |
| 2005/0242395 A1 | 11/2005 | Chen et al. | |
| 2006/0046449 A1 | 3/2006 | Liaw | |
| 2008/0296702 A1 | 12/2008 | Lee et al. | |
| 2009/0057776 A1 | 3/2009 | Mehrad et al. | |
| 2013/0062669 A1 | 3/2013 | Chen et al. | |
| 2014/0065782 A1 * | 3/2014 | Lu ........................ | H10D 62/116 257/E21.409 |
| 2014/0203370 A1 | 7/2014 | Maeda et al. | |
| 2014/0264604 A1 * | 9/2014 | Tsai ..................... | H10D 62/115 438/283 |
| 2014/0319097 A1 | 10/2014 | Kim et al. | |
| 2014/0374827 A1 * | 12/2014 | Suh ........................ | H10D 30/62 257/347 |
| 2015/0021683 A1 | 1/2015 | Xie et al. | |
| 2015/0091086 A1 * | 4/2015 | Lu ........................ | H10D 62/021 438/283 |
| 2015/0303118 A1 | 10/2015 | Wang et al. | |
| 2016/0111537 A1 | 4/2016 | Tsai et al. | |
| 2016/0141423 A1 | 5/2016 | Diaz et al. | |
| 2016/0190141 A1 | 6/2016 | Lee et al. | |
| 2016/0322304 A1 | 11/2016 | Kim et al. | |
| 2018/0061830 A1 | 3/2018 | Wang et al. | |
| 2018/0174953 A1 | 6/2018 | Nam et al. | |

* cited by examiner

SEMICONDUCTOR DEVICE STRUCTURE

PRIORITY CLAIM AND CROSS-REFERENCE

This application is a divisional application of U.S. patent application Ser. No. 15/797,973, filed on Oct. 30, 2017, entitled of "SEMICONDUCTOR DEVICE STRUCTURE WITH SALICIDE LAYER AND METHOD FOR FORMING THE SAME," which is incorporated herein by reference in its entirety.

BACKGROUND

The semiconductor integrated circuit (IC) industry has experienced rapid growth. Technological advances in IC materials and design have produced generations of ICs. Each generation has smaller and more complex circuits than the previous generation.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

Such scaling down has also increased the complexity of processing and manufacturing ICs and, for these advances to be realized, similar developments in IC processing and manufacturing are needed. For example, a three-dimensional transistor, such as a semiconductor device with fin field-effect transistors (FinFETs), has been introduced to replace planar transistors. These relatively new types of semiconductor IC devices face manufacturing challenges, and they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
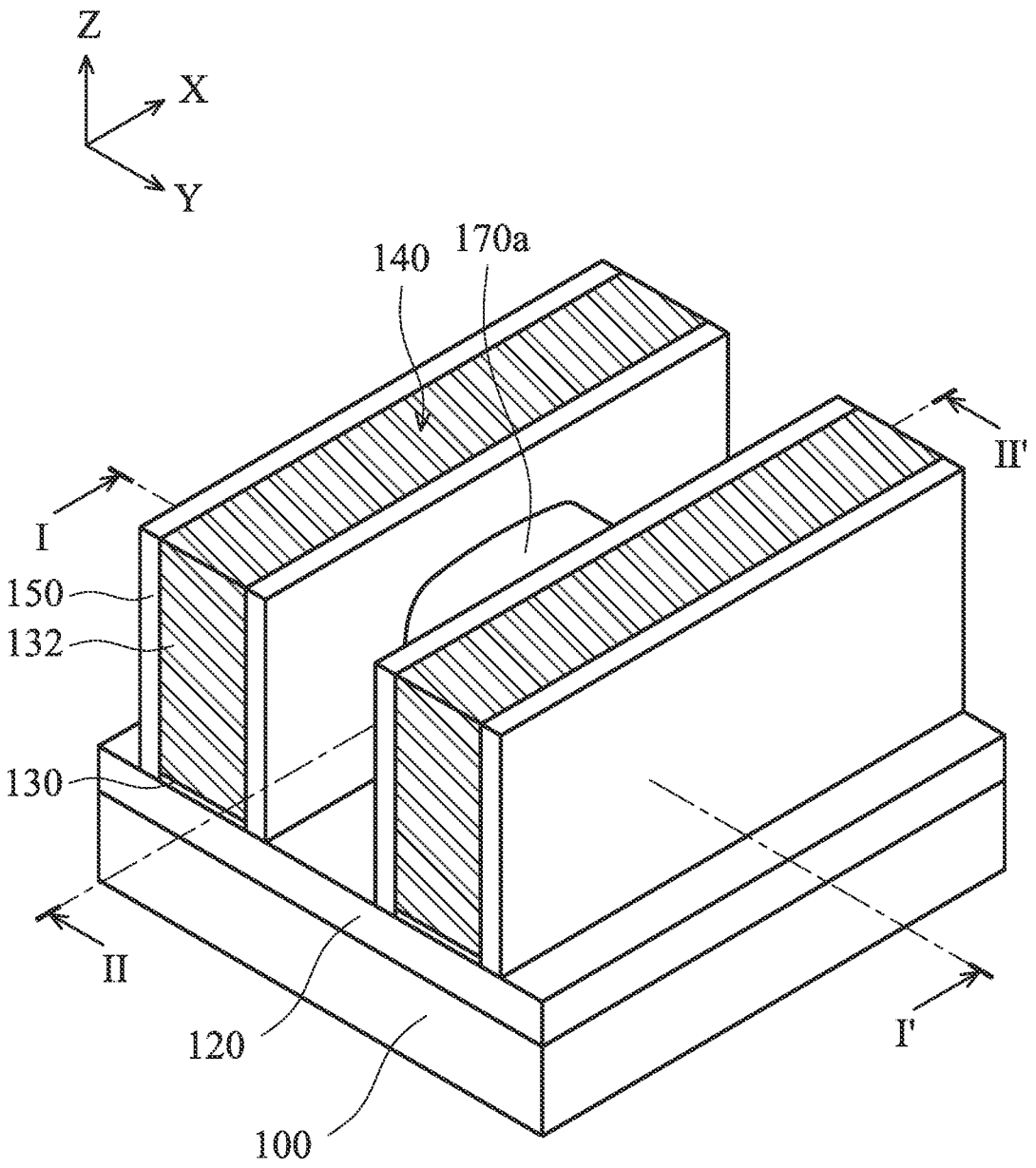
FIG. 1 is a perspective view of one stage of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the disclosure form a semiconductor device structure with a salicide layer which has a greater surface area. Some embodiments of the disclosure are described. FIG. 1 is a perspective view of one stage of a process for forming a semiconductor device structure, in accordance with some embodiments. For a better understanding of the semiconductor device structure, an X-Y-Z coordinate reference is provided in FIG. 1. The X-axis is generally orientated along a substrate surface of a semiconductor device structure in the lateral direction. The Y-axis is generally oriented along the substrate surface perpendicular to the X-axis. The Z-axis is generally oriented along the direction perpendicular to the X-Y plane.

Figure 2A:
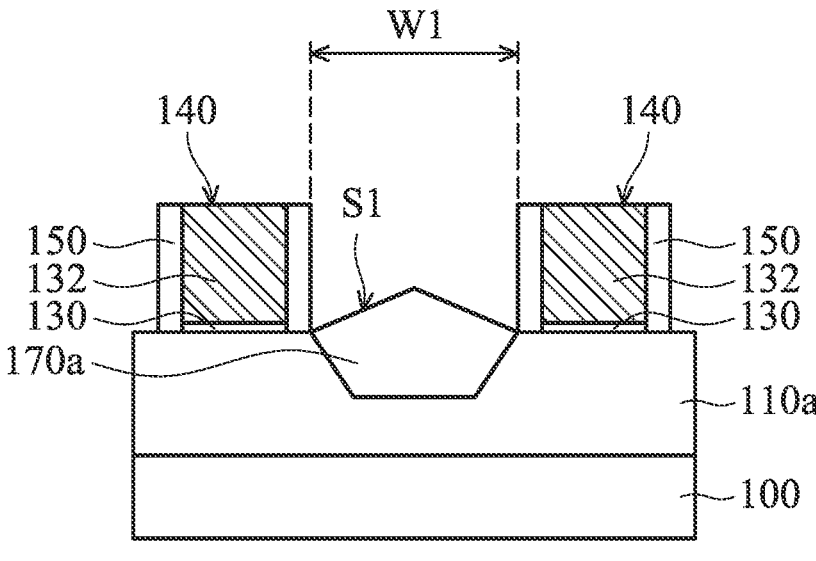
FIGS. 2A-2O are cross-sectional views of various stages of a process for forming a semiconductor device structure, in accordance with some embodiments.
Figure 3A:
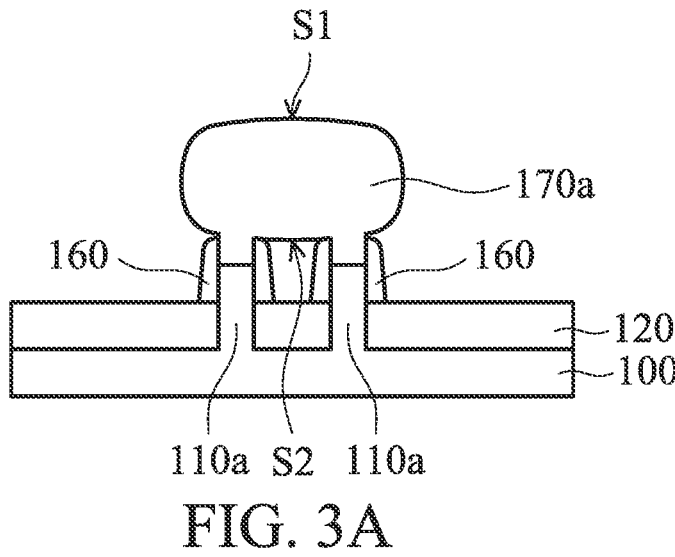
FIGS. 3A-3O are cross-sectional views of various stages of a process for forming a semiconductor device structure, in accordance with some embodiments.
Figure 2B:
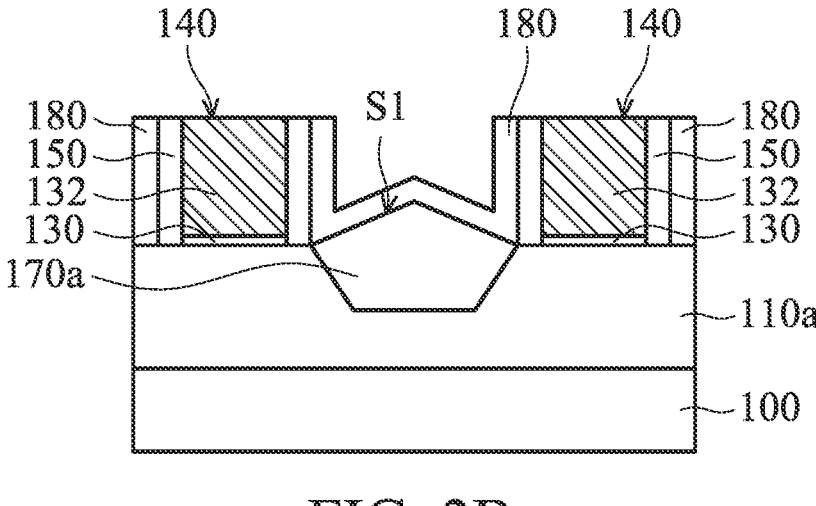
Figure 2C:
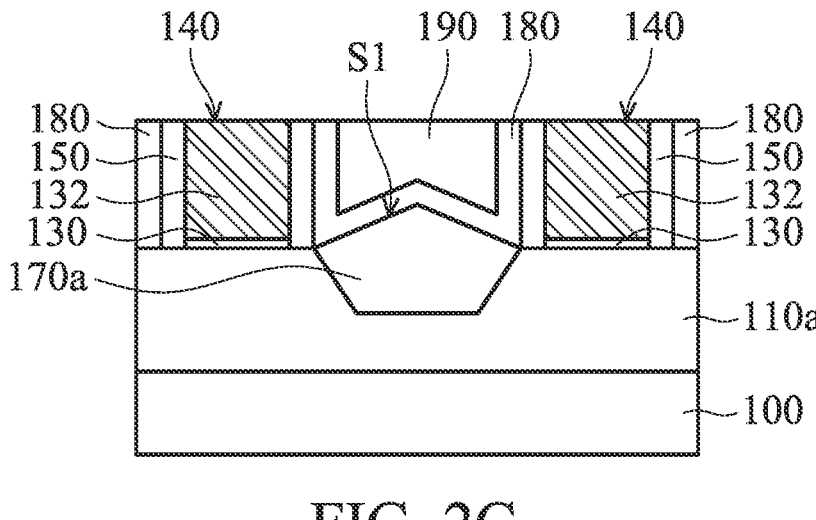
Figure 2D:
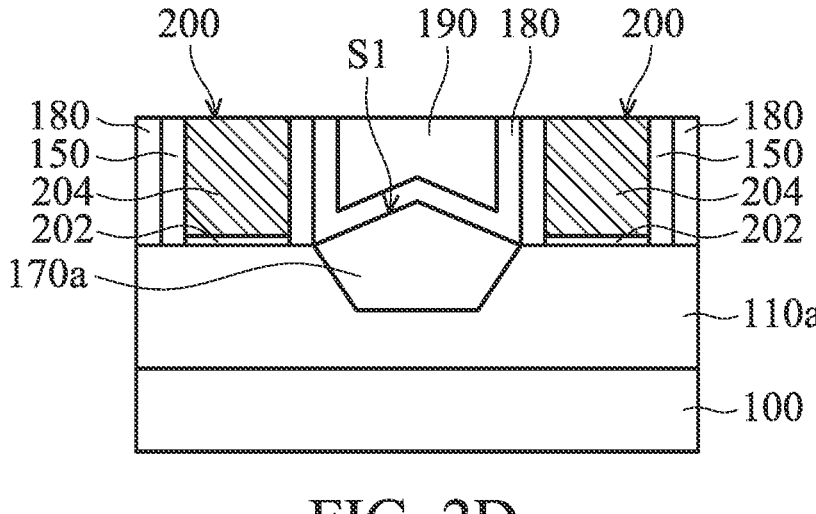
Figure 3D:
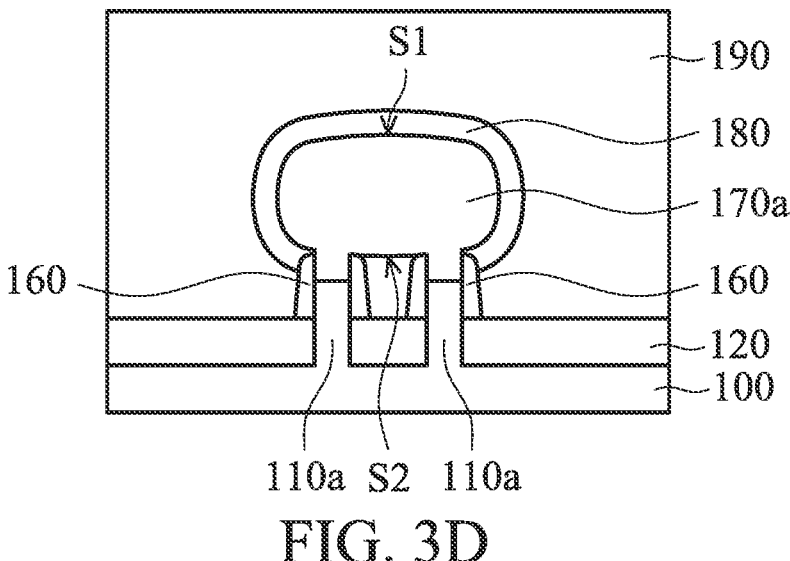
Figure 2E:
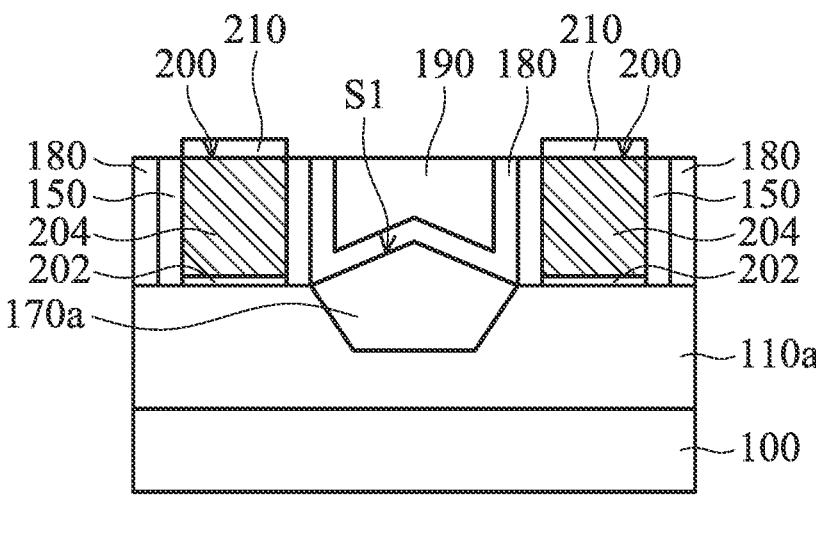
Figures 2F, 3F:
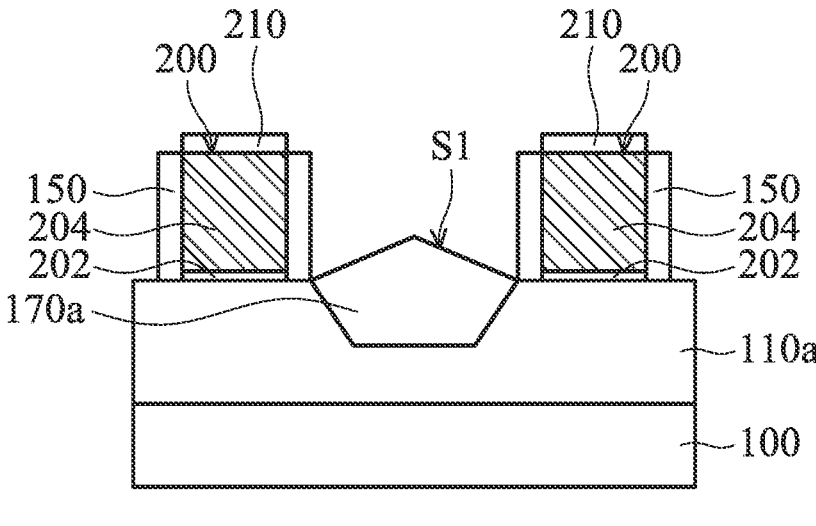
Figure 2G:
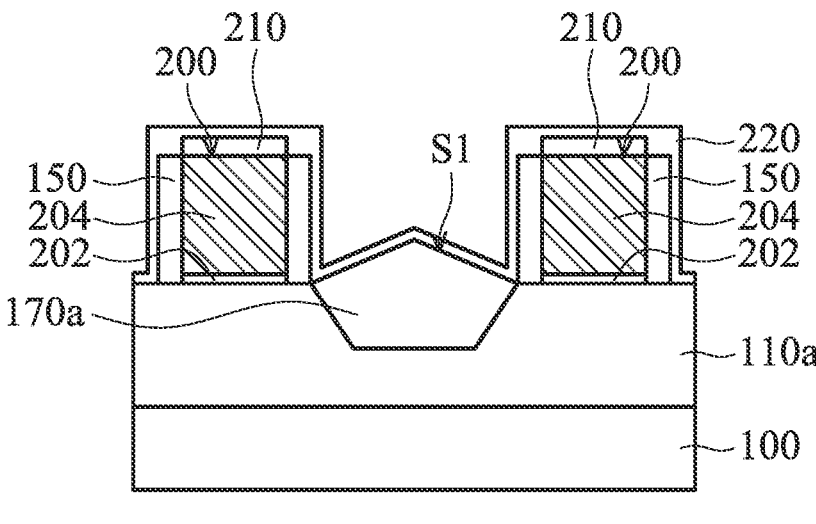
Figures 2H, 3H:
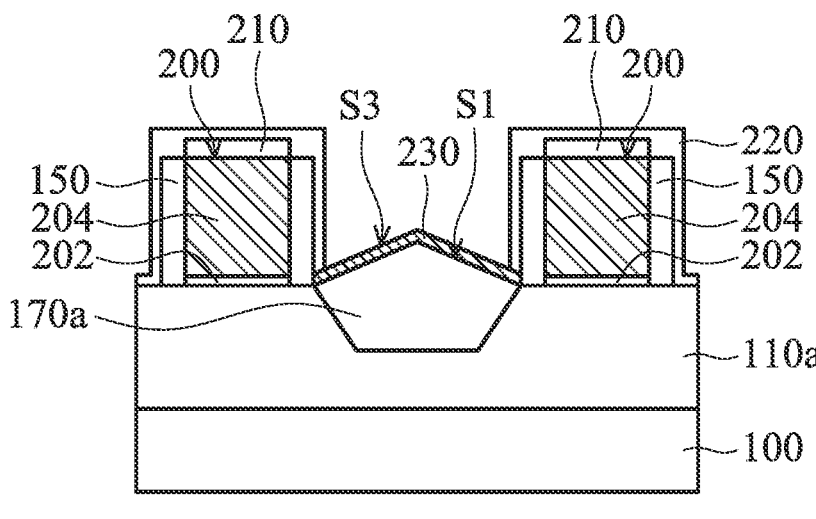
Figures 2I, 3I:
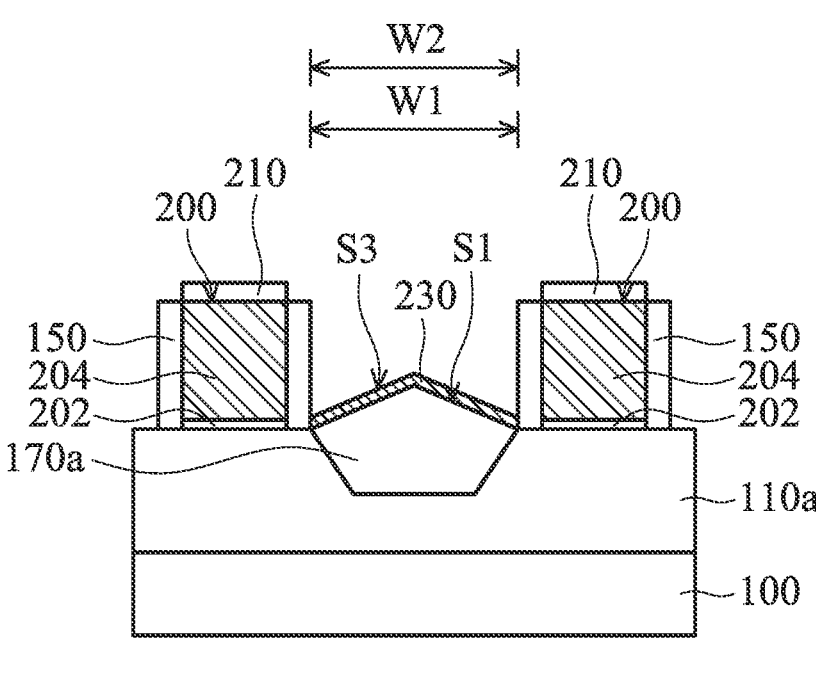
Figure 2J:
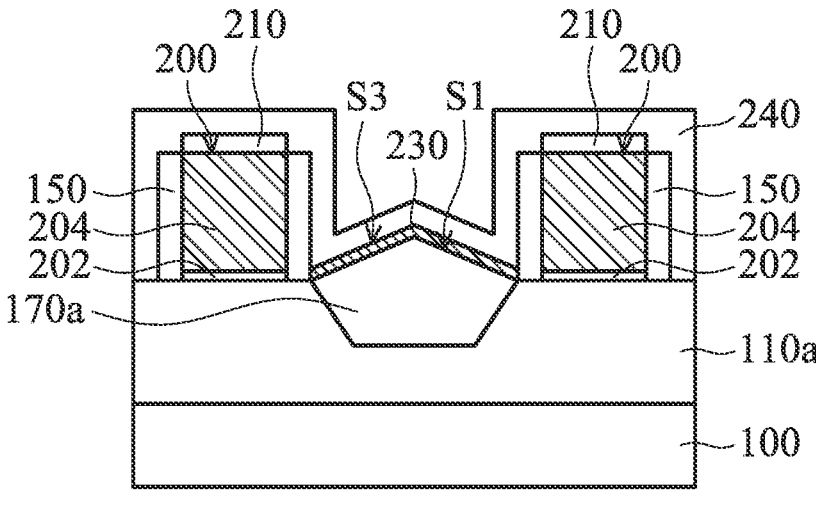
Figure 2K:
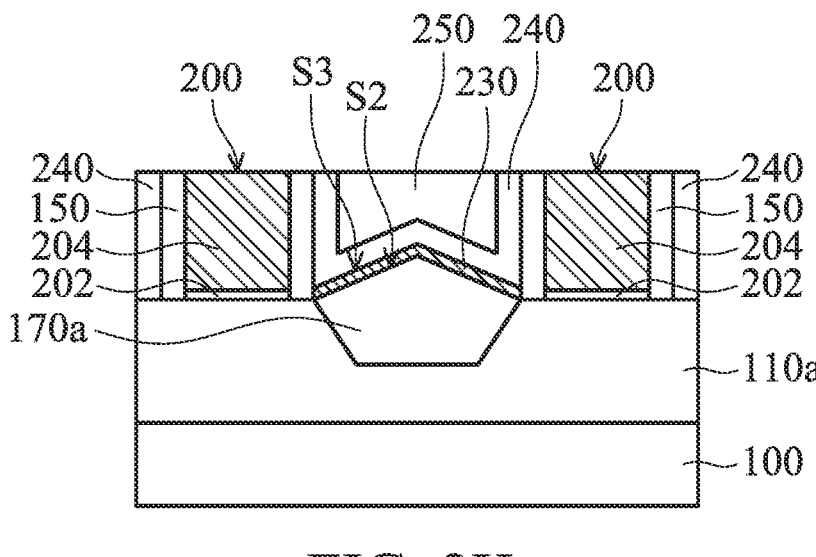
Figure 2L:
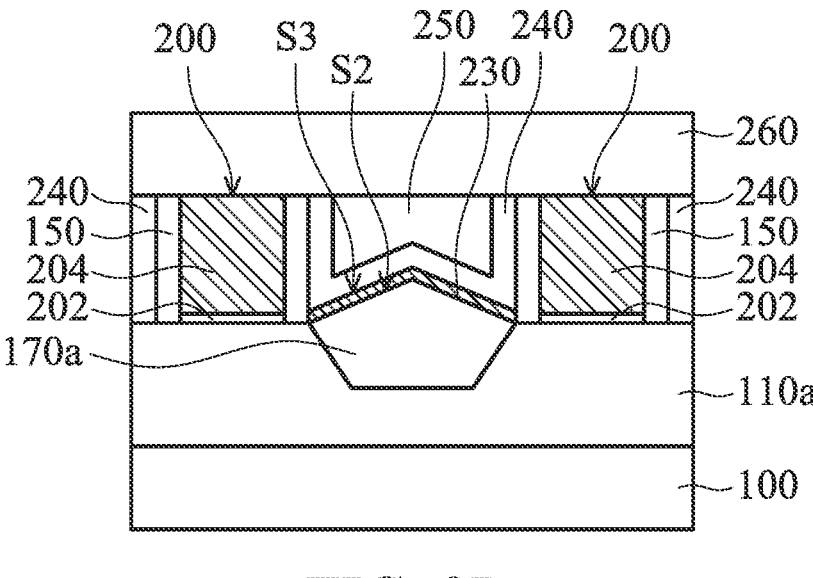
Figure 2M:
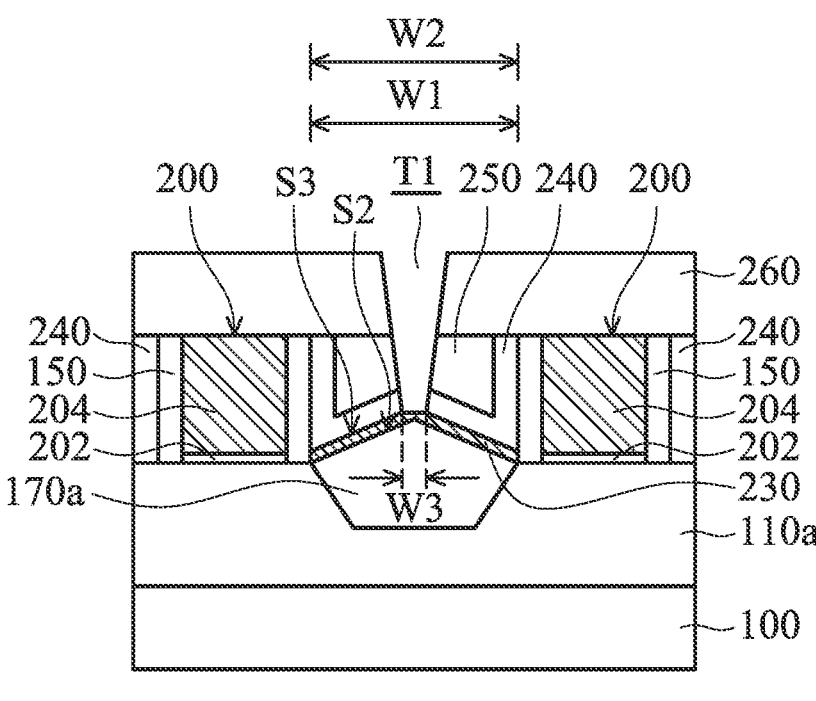
Figure 2N:
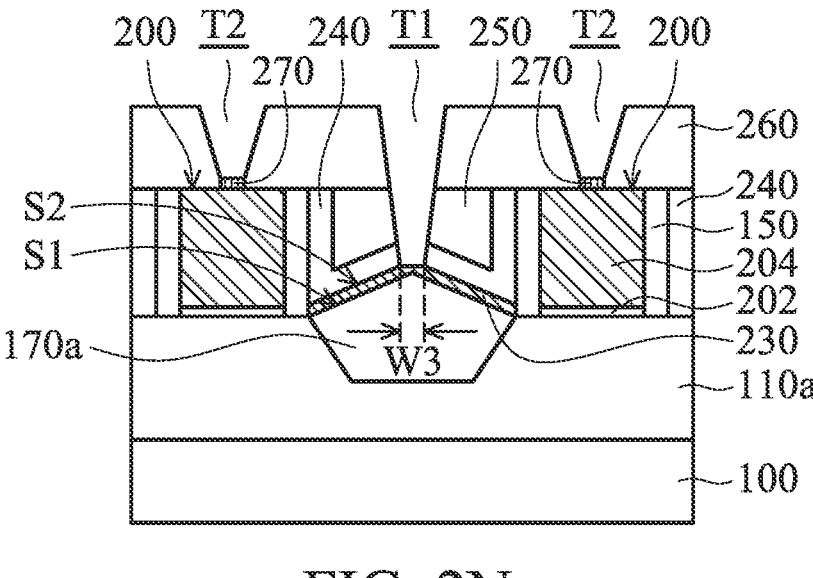
Figure 2O:
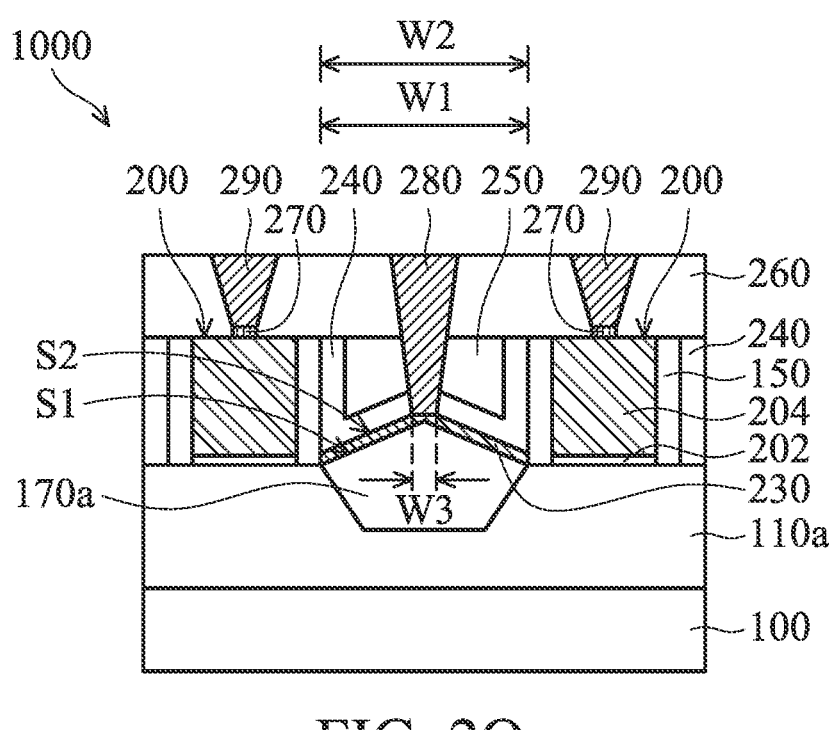

FIGS. 2A-2O are cross-sectional views of various stages of a process for forming a semiconductor device structure, in accordance with some embodiments. In some embodiments, FIGS. 2A-2O are cross-sectional views taken along line I-I' shown in FIG. 1. Line I-I' may be substantially parallel to the Y-axis. FIGS. 3A-3O are cross-sectional views of various stages of a process for forming a semiconductor device structure, in accordance with some embodiments. In some embodiments, FIGS. 3A-3O are cross-sectional views taken along line II-II' shown in FIG. 1. Line II-II' may be substantially parallel to the X-axis.

More specifically, FIGS. 2A-2O illustrate the cross-sectional views of gate structures, fin structures and a source/drain structure, FIGS. 3A-3O are cross-sectional views between two gate structures, which illustrate the fin structures and the source/drain structure.

Additional operations can be provided before, during, and/or after the stages described in FIG. 1, FIGS. 2A-2O, FIGS. 3A-3O, FIG. 4 and FIG. 5. Some of the stages that are described can be replaced or eliminated for different embodiments. Additional features can be added to the semiconductor device structure. Some of the features described below can be replaced or eliminated for different embodiments.

As shown in FIGS. 1, 2A and 3A, a semiconductor substrate 100 is provided. The surface of the semiconductor substrate 100 is substantially parallel to the X-Y plane. In some embodiments, the semiconductor substrate 100 is a bulk semiconductor substrate, such as a semiconductor wafer. In some embodiments, the semiconductor substrate 100 includes silicon or another elementary semiconductor material such as germanium. For example, the semiconductor substrate 100 is a silicon wafer. In some other embodiments, the semiconductor substrate 100 includes a compound semiconductor. The compound semiconductor may include gallium arsenide, silicon carbide, indium arsenide, indium phosphide, another suitable compound semiconductor, or a combination thereof.

In some embodiments, the semiconductor substrate 100 includes a semiconductor-on-insulator (SOI) substrate. The SOI substrate may be fabricated using a wafer bonding process, a silicon film transfer process, a separation by implantation of oxygen (SIMOX) process, another applicable method, or a combination thereof.

As shown in FIG. 3A, multiple fin structures 110 are over the semiconductor substrate 100, in accordance with some embodiments. The fin structures 110a may be patterned by any suitable method. For example, the fin structures 110a may be patterned using one or more photolithography processes, including double-patterning or multi-patterning processes. Generally, double-patterning or multi-patterning processes combine photolithography and self-aligned processes, allowing patterns to be created that have, for example, pitches that are smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

As shown in FIGS. 1 and 3A, isolation features 120 are formed in the recesses of the semiconductor substrate 100 to surround lower portions of the fin structures 110a, in accordance with some embodiments. The isolation features 120 are used to define and electrically isolate various device elements formed in and/or over the semiconductor substrate 100. In some embodiments, the isolation features 120 include shallow trench isolation (STI) features, local oxidation of silicon (LOCOS) features, other suitable isolation features, or a combination thereof.

In some embodiments, the isolation features 120 are made of a dielectric material. The dielectric material may include silicon oxide, silicon nitride, silicon oxynitride (SiON), spin-on glass, low-K dielectric material, another suitable material, or a combination thereof. In some embodiments, each of the isolation features 120 has a multi-layer structure. In some embodiments, a dielectric material layer is deposited over the semiconductor substrate 100. The dielectric material layer covers the fin structures 110a and fills the recesses between the fin structures 110a. In some embodiments, the dielectric material layer is deposited using a chemical vapor deposition (CVD) process, a spin-on process, another applicable process, or a combination thereof. In some embodiments, a planarization process is performed to thin down the dielectric material layer until the top surfaces of the fin structures 110a are exposed. The planarization process may include a chemical mechanical polishing (CMP) process, a grinding process, an etching process, another applicable process, or a combination thereof. Afterwards, the dielectric material layer is etched back to form the isolation features 120. The fin structures 110a protrude from the isolation features 120, as shown in FIGS. 1 and 3A, in accordance with some embodiments.

As shown in FIGS. 1 and 2A, gate structures 140 are formed over the semiconductor substrate 100, in accordance with some embodiments. The gate structures 140 partially cover multiple fin structures 110a and multiple isolation features 120. In some embodiments, each gate structure 140 extends along the X-axis and a numbers of the gate structures 140 are arranged in a direction that is substantially parallel to the Y-axis, as shown in FIG. 1. The gate structures 140 may be a sacrificial gate structure, which will be removed in a subsequent process. In some embodiments, some portions of the gate structures 140 are formed over the fin structures 110a, as shown in FIG. 2A.

In some embodiments, each of the gate structures 140 includes a gate dielectric layer 130 and a gate electrode 132. The gate dielectric layer 130 extends over the fin structures 110a and the isolation features 120. In some embodiments, the gate dielectric layer 130 is a sacrificial or dummy gate dielectric layer and will be replaced with another gate dielectric layer. In some embodiments, the gate dielectric layer 130 is made of a high-K dielectric material. Examples of high-K dielectric materials include hafnium oxide, zirconium oxide, aluminum oxide, silicon oxynitride, hafnium dioxide-alumina alloy, hafnium silicon oxide, hafnium silicon oxynitride, hafnium tantalum oxide, hafnium titanium oxide, hafnium zirconium oxide, another suitable high-K material, and combinations thereof.

The gate electrode 132 is formed over the gate dielectric layer 130. In some embodiments, the gate electrode 132 includes a polysilicon, a metal material, another suitable conductive material, or a combination thereof. In some embodiments, the gate electrode 132 is a sacrificial or dummy gate electrode layer and will be replaced with another conductive material such as a metal material. The sacrificial gate electrode layer is made of a sacrificial material, for example, polysilicon.

In some embodiments, the gate structures 140 include a hard mask (not shown) which is formed over the gate electrode 132. The hard mask may be used to assist in the patterning process for forming the gate dielectric layer 130 and the gate electrode 132. In some embodiments, the hard mask includes silicon oxide, silicon nitride, silicon oxynitride, silicon carbide, another suitable material, or a combination thereof. In some embodiments, the hard mask has a multi-layer structure.

For example, in some embodiments, a gate dielectric material layer and a gate electrode layer are sequentially deposited by using suitable deposition methods. The suitable deposition methods may a CVD process, an atomic layer deposition (ALD) process, a thermal oxidation process, a physical vapor deposition (PVD) process, another applicable process, or a combination thereof. Afterwards, a photolithography process and an etching process are performed to pattern the hard mask layer. With the assistance of the patterned hard mask, the gate dielectric material layer and the gate electrode layer are etched and patterned. As a result, the gate dielectric layer 130 and the gate electrode 132 are formed.

As shown in FIGS. 1 and 2A, gate spacers 150 are formed over sidewalls of the gate structures 140, in accordance with some embodiments. The gate spacers 150 may contain a group-IV element, a group-V element, and/or a group-VI element. In some embodiments, the gate spacers 150 are made of silicon nitride, silicon oxynitride, silicon carbide, silicon oxycarbide, another suitable material, or a combination thereof. In some embodiments, a spacer layer is deposited using a CVD process, a PVD process, a spin-on process, another applicable process, or a combination thereof. Afterwards, an etching process, such as an anisotropic etching process, is performed to partially remove the spacer layer. As a result, the remaining portions of the spacer layer over the sidewalls of the gate structures 140 form the gate spacers 150.

In some embodiments, each of the gate spacers 150 is a single layer, as shown in FIG. 2A. In some embodiments, each of the gate spacers 150 has a multi-layer structure. For example, each of the gate spacers 150 may include multiple nitride layers. Many variations and/or modifications can be made to embodiments of the disclosure. In some other embodiments, the gate spacers 150 are not formed.

As shown in FIG. 3A, fin spacers 160 are formed over sidewalls of the fin structures 110a, in accordance with some embodiments. The fin spacers 160 are used to define the profile of subsequently formed source/drain structures. The fin spacers 160 may contain a group-IV element, a group-V element, and/or a group-VI element. In some embodiments, the fin spacers 160 are made of silicon nitride, silicon oxynitride, silicon carbide, silicon oxycarbide, another suitable material, or a combination thereof. In some embodiments, the fin spacers 160 and the gate spacers 150 are made of the same material. In some embodiments, the fin spacers 160 and the gate spacers 150 are made of different materials.

In some embodiments, a spacer layer is deposited using a CVD process, a PVD process, a spin-on process, another applicable process, or a combination thereof. Afterwards, an etching process, such as an anisotropic etching process, is performed to partially remove the spacer layer. As a result, the remaining portions of the spacer layer over the sidewalls of the fin structures 110a form the fin spacers 160.

Subsequently, as shown in FIGS. 1, 2A and 3A, source/drain (S/D) structure 170a is formed over the fin structures 110a, in accordance with some embodiments. The S/D structure 170a may be used to provide stress or strain to channel regions in the fin structures 110a below the gate structures 140.

In some embodiments, the fin structures 110a are removed to form recesses, and a semiconductor material (or two or more semiconductor materials) is epitaxially grown over the recesses of the fin structures 110a, as shown in FIGS. 2A and 3A. The semiconductor material is growing continually to form the S/D structure 170a. In some embodiments, the S/D structure 170a is a single layer, as shown in FIGS. 1 and 3A. In some embodiments, the S/D structure 170a is multi-layers and each layer has different ratio of components from each other.

As shown in FIG. 2A, the S/D structure 170a is formed between two gate structures 140. In some embodiments, the S/D structure 170a adjoins two fin structures 110a and the gate spacers 150, as shown in FIGS. 2A and 3A. In some embodiments, some portions of the fin structures 110a are exposed by the fin spacers 160, and the top surface of the fin structures 110a are lower than the top portion of the fin spacers. The S/D structure 170a are grown over the fin structures 110a that are not covered by the fin spacers 160, as shown in FIG. 3A. In some embodiments, the S/D structure 170a is in direct contact with the fin spacers 160, and a portion of the S/D structure 170a is formed in the recess of the fin structures 110a.

In some embodiments, the S/D structure 170a is a diamond shaped in the cross-section plane along the Y-axis due to a crystalline structure as shown in FIG. 2A. In some embodiments, the S/D structure 170a is an oval shaped in the cross-section plane along the X-axis as shown in FIG. 3A.

In some embodiments, the S/D structure 170a has a first surface S1 which covers the top surfaces of two of the fin structures 110a, as shown in FIG. 3A. The first surface S1 is a top surface extending outwardly from one sidewall of one of the fin structures 110a to one sidewall of another of fin structures 110a. In some embodiments, a portion of the first surface S1 extends between two gate spacers 150 of two adjacent gate structures 140, as shown in FIG. 2A. In some embodiments, the first surface S1 of the S/D structure 170a has a width W1 which is a pitch between two gate spacers 150, as shown in FIG. 2A.

In some embodiments, the S/D structure 170a has a second surface S2 extending between two of the fin structures 110a, as shown in FIG. 3A. More specifically, the second surface S2 is a bottom surface extending between two neighboring sidewalls of different fin structures 110a. Moreover, as shown in FIG. 3A, the second surface S2 is under the first surface S1.

In some embodiments, the S/D structure 170a is a P-type semiconductor material. For example, the S/D structure 170a may include epitaxially grown silicon or epitaxially grown silicon germanium. The S/D structure 170a is not limited to being a P-type semiconductor material. In some embodiments, the S/D structure 170a is an N-type semiconductor material. The S/D structure 170a may include epitaxially grown silicon, silicon-germanium (SiGe), epitaxially grown phosphorous-doped silicon (SiP), boron-doped silicon germanium (SiGeB) or another suitable epitaxially grown semiconductor material.

In some embodiments, the S/D structure 170a is formed using a selective epitaxy growth (SEG) process, a CVD process (e.g., a vapor-phase epitaxy (VPE) process, a low pressure CVD (LPCVD) process, and/or an ultra-high vacuum CVD (UHV-CVD) process), a molecular beam epitaxy process, deposition of doped amorphous semiconductor (e.g. Si, Ge or SiGe) followed by a solid-phase epitaxial recrystallization (SPER) step, another applicable process, or a combination thereof. The formation process of the S/D structure 170a may use gaseous and/or liquid precursors. In some embodiments, the S/D structure 170a is grown in-situ in the same process chamber. In other words, the S/D structure 170a is formed using an in-situ epitaxial growth process. In some other embodiments, some of the S/D structure 170a is grown separately.

In some embodiments, the S/D structure 170a is doped with one or more suitable dopants. For example, the S/D structure 170a is Si source or drain features doped with phosphorus (P), arsenic (As), or another suitable dopant. Alternatively, the S/D structure 170a is SiGe source or drain features doped with boron (B) or another suitable dopant. In some embodiments, multiple implantation processes are performed to dope the S/D structure 170a.

In some embodiments, the S/D structure 170a is doped in-situ during the growth of the S/D structure 170a. In some other embodiments, the S/D structure 170a is not doped during the growth of the S/D structure 170a. After the epitaxial growth, the S/D structure 170a is doped in a subsequent process. In some embodiments, the doping is achieved using an ion implantation process, a plasma immersion ion implantation process, a gas and/or solid source diffusion process, another applicable process, or a combination thereof. In some embodiments, the S/D structure 170a is further exposed to annealing processes to activate the dopants. For example, a rapid thermal annealing process is performed.

Figure 3B:
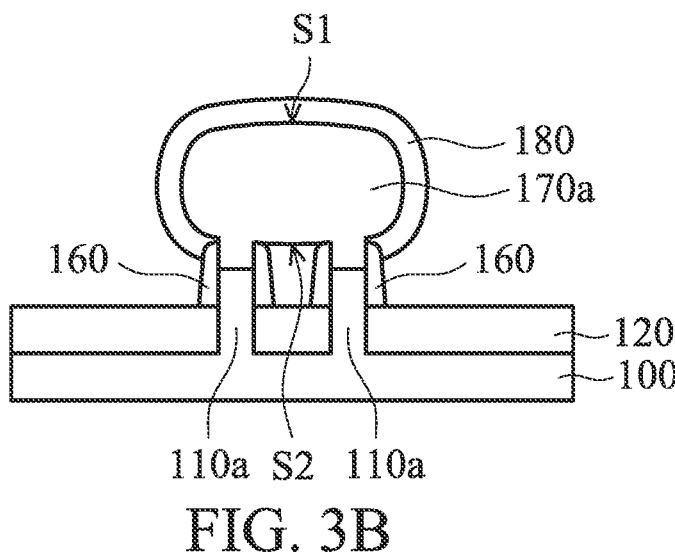

As shown in FIGS. 2B and 3B, a liner 180 is formed over the sidewalls of the gate spacers 150 and conformally over the S/D structure 170a, in accordance with some embodiments. The liner 180 may be used to reduce defects at the interface between the S/D structure 170a and the subsequently formed dummy material layer. In some embodiments, the lower portion of the S/D structure 170a is not covered by the liner 180, and the top portion of the S/D structure 170*a* is in directly contact with the liner 180. More specifically, the liner 180 does not completely surround the S/D structure 170*a*, as shown in FIG. 3B.

In some embodiments, the liner 180 is a dielectric material layer which includes silicon nitride, silicon oxynitride, silicon carbide, silicon oxycarbide, another suitable material, or a combination thereof. In some embodiments, the dielectric material layer is deposited using a CVD process, a PVD process, a spin-on process, another applicable process, or a combination thereof. In some embodiments, a planarization process is performed to thin down the dielectric material layer until the top surfaces of the gate structures 140 and the gate spacers 150 are exposed, and the liner 180 is formed. The planarization process may include a CMP process, a grinding process, an etching process, another applicable process, or a combination thereof.

Figure 3C:
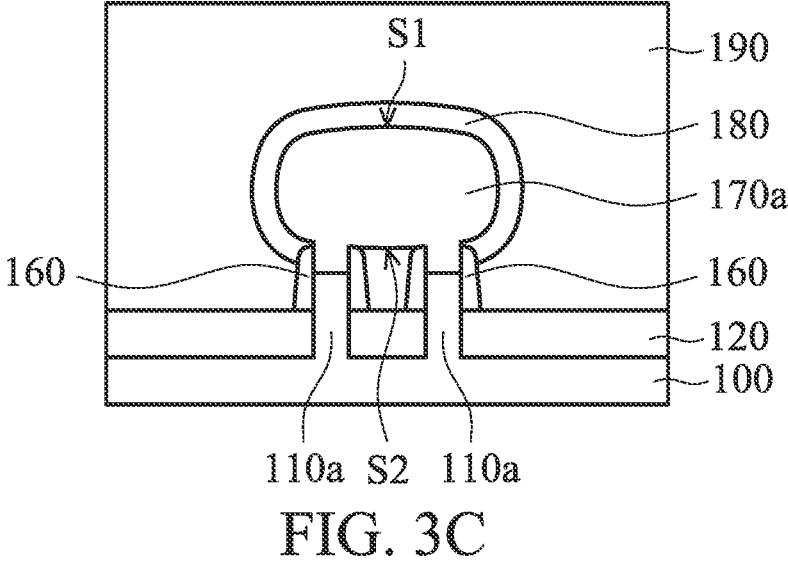

As shown in FIGS. 2C and 3C, a dummy or sacrificial material layer 190 is deposited over the liner 180 and the S/D structure 170*a*, and between the two gate structures 140, in accordance with some embodiments. In some embodiments, the dummy material layer 190 does not fill between the fin structures 110*a*. The dummy material layer 190 will be removed during a subsequent process.

In some embodiments, the material of the dummy material layer 190 includes Ge, amorphous silicon, spin-on carbon (SOC), another suitable semiconductor and/or dielectric material. In some embodiments, the material of the dummy material layer 190 has a high etch selectivity to the gate spacer 150 and the fin spacers 160. More specifically, when the subsequently etching process is performed, the etchant has a high etching selectivity to the dummy material layer 190 than the gate spacer 150 and the fin spacers 160. Therefore, the dummy material layer 190 is etched much faster than the gate spacer 150 and the fin spacers 160. In some embodiments, the dummy material layer 190 has a multi-layer structure. In some embodiments, the dummy material layer 190 is deposited using a CVD process, a PVD process, a spin-on process, another applicable process, or a combination thereof.

As shown in FIGS. 2D and 2E, the gate structures 140 are replaced with gate structures 200, in accordance with some embodiments. In some embodiments, each of the gate structures 200 includes a gate dielectric layer 202 and a gate electrode 204. In some embodiments, the gate dielectric layer 130 and the gate electrode 132 of the gate structures 140 are removed by a dry etching process, a wet etching process or another applicable etching process. In some embodiments, the materials and formation methods of the gate dielectric layer 202 and the gate electrode 204 are the same as or similar to those of the gate dielectric layer 130 and the gate electrode 132, respectively.

In some other embodiments, the gate dielectric layer 202 and the gate electrode 204 are made of different dielectric materials from the gate dielectric layer 130 and the gate electrode 132, respectively. In some embodiments, the gate electrode 204 are made of a metal material such as TiN, TaN, TaC, Co, Ru, Al, W or a combination thereof.

Moreover, additional layers can be added to form the gate structures 200. The gate electrode 204 may include one or more metal gate stacking layers (not shown). Examples of the metal gate stacking layers include a barrier layer, a work function layer, a blocking layer, a glue layer, a metal filling layer, another suitable metal gate layer, and combinations thereof. Some of these metal gate stacking layers can be replaced or eliminated for different embodiments. Additional layers can be added to form the metal gate stacking layers.

Figure 3E:
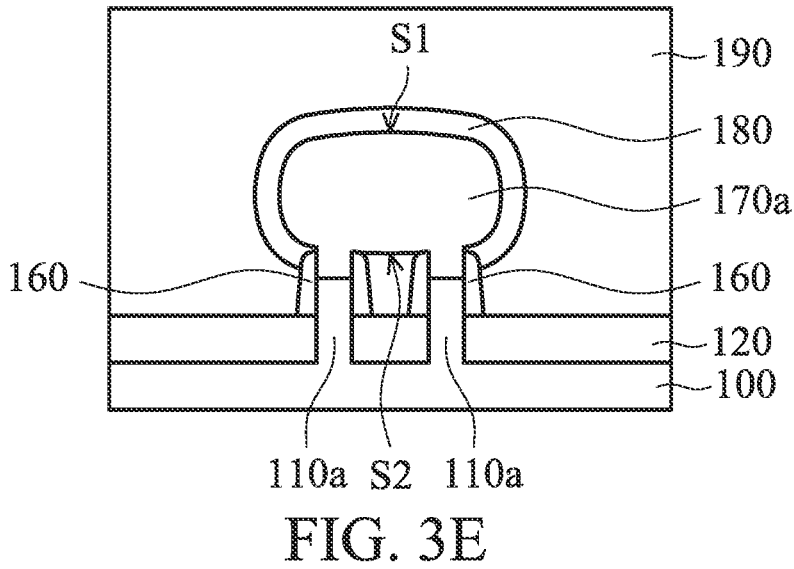

As shown in FIGS. 2E and 3E, mask structures 210 are formed over the gate structures 200 to cover the top surfaces of the gate structures 200, in accordance with some embodiments. The mask structures 210 are used to protect the gate structures 200 from damage during subsequent etching process or other processes. In some embodiments, the mask structures 210 cover the gate structures 200 without covering the gate spacers 150, the liner 180 and the dummy material layer 190.

In some embodiments, the mask structures 210 include silicon oxide, silicon nitride, silicon oxynitride, silicon carbide or a combination thereof. In some embodiments, the hard mask 210 has a multi-layer structure. Many variations and/or modifications can be made to embodiments of the disclosure. In some other embodiments, the mask structures 210 are not formed.

As shown in FIGS. 2F and 3F, an etching process is performed to remove the liner 180 and the dummy material layer 190, in accordance with some embodiments. In some embodiments, after the liner 180 and the dummy material layer 190 are removed, the first surface S1 of the S/D structure 170*a* is exposed. In some embodiments, after the liner 180 and the dummy material layer 190 are removed, the sidewalls of the gate spacers 150 are exposed. In some embodiments, after the liner 180 and the dummy material layer 190 are removed, the sidewalls of the fin spacers 160 are exposed. In some embodiments, the dummy material layer 190 is removed faster than the gate spacers 150 and the fin spacers during the removal of the liner 180 and the dummy material layer 190.

In some embodiments, the etching process includes a dry etching process (such as a plasma etching process) or another applicable etching process. In some embodiments, the etchant used in the etching process contains carbon and fluorine or another suitable etching gas. For example, the etchant used in the etching process may include tetrafluoromethane ($CF_4$), fluoromethane ($CH_3F$), hexa-fluoro-buta-diene ($C_4F_6$), or another suitable etching gas.

Figure 3G:
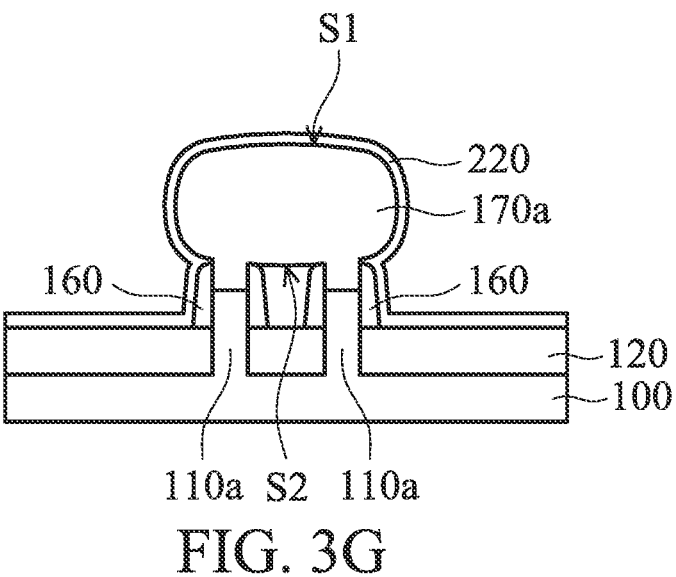

As shown in FIGS. 2G and 3G, after the first surface S1 of the S/D structure 170*a* is exposed, a metal layer 220 is deposited over the mask structures 210, the gate spacers 150, the S/D structure 170*a* and the fin spacers 160, in accordance with some embodiments. The metal layer 220 is made of or includes titanium, cobalt, tungsten, nickel or other applicable metal materials. The metal layer 220 is deposited using a PVD process such as a sputtering process, a CVD process, a spin-on process, another applicable process, or a combination thereof.

In some embodiments, the first surface S1 of the S/D structure 170*a* is covered completely by the metal layer 220, as shown in FIG. 3G. In some embodiments, the metal layer 220 is not formed on the second surface S2 of the S/D structure 170*a*, as shown in FIG. 3G.

As shown in FIGS. 2H and 3H, after the metal layer 220 is deposited, a salicide layer 230 is formed over the S/D structure 170*a*, in accordance with some embodiments. In some embodiments, an anneal process is performed after the metal layer 220 is deposited over the S/D structure 170*a*. Afterwards, the metal layer 220 reacts with the S/D structure 170*a* to form the salicide layer 230 at an interface between the metal layer 220 and the S/D structure 170*a*. As shown in FIGS. 2H and 3H, the unreacted portion of the metal layer 220 remains over the isolation features 120, the mask structures 210, the sidewalls of the gate spacers 150 and the sidewalls of the fin spacers 160.

In some embodiments, the first surface S1 of the S/D structure 170*a* is covered completely and surrounded by the salicide layer 230, as shown in FIGS. 2H and 3H. In some embodiments, the salicide layer 230 covers the top surfaces of the fin structures 110*a*, as shown in FIG. 3H. As shown in FIG. 3H, the salicide layer 230 has a third surface S3 extending outwardly from one sidewall of one of the fin structures 110*a* to another sidewall of another of the fin structures 110*a*. In some embodiments, the salicide layer 230 extends to the fin spacers 160. In some embodiments, the top surface of the S/D structure 170*a* is covered completely by the salicide layer 230.

More specifically, the first surface S1 is surrounded continuously by the salicide layer 230. In some embodiments, the top surface of the S/D structure 170*a* is surrounded by the salicide layer 230. In some embodiments, the salicide layer 230 is not formed on the second surface S2 of the S/D structure 170*a*, and the second surface S2 of the S/D structure 170*a* is not covered by the salicide layer 230. In some embodiments, the salicide layer 230 adjoins the fin spacers 160, as shown in FIG. 3H. Since the salicide layer 230 has the third surface S3 whose profile is similar to that of the S/D structure 170*a*, the salicide layer 230 can provide more area for electrically connecting to a subsequently formed contact. In some embodiments, the thickness of the salicide layer 230 is in a range from about 5 nm to about 7 nm.

As shown in FIGS. 2I and 3I, after the salicide layer 230 is formed, the remaining unreacted portion of the metal layer 220 is removed, in accordance with some embodiments. The remaining unreacted portion of the metal layer 220 may be removed by an etching process such as a wet etching process, a dry etching process, one or more other applicable processes, or a combination thereof. In some embodiments, after the metal layer 220 is removed, the third surface S3 of the salicide layer 230 is exposed completely, as shown in FIGS. 2I and 3I. In some embodiments, the third surface S3 of the salicide layer 230 has a second width W2 which is substantially equivalent to the first width W1, as shown in FIG. 2I. In some embodiments, the salicide layer 230 extends to the gate spacers 150, as shown in FIG. 2I. In some embodiments, the salicide layer 230 adjoins the gate spacers 150, as shown in FIG. 2I.

Figure 3J:
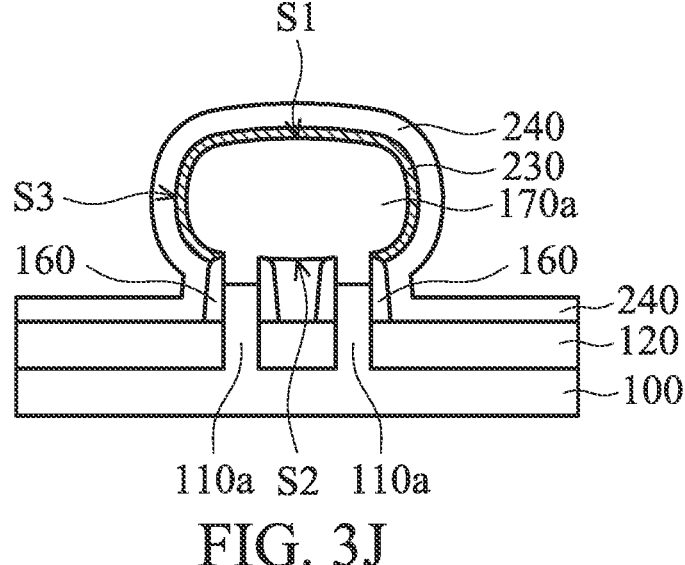

As shown in FIGS. 2J and 3J, after the unreacted portion of the metal layer 220 is removed, a capping layer 240 is deposited, in accordance with some embodiments. The capping layer 240 covers the third surface S3 and surrounds the salicide layer 230. In some embodiments, the capping layer 240 is in direct contact with the salicide layer 230.

The capping layer 240 may contain an insulating material including group-IV element, a group-V element, and/or a group-VI element. In some embodiments, the capping layer 240 is made of silicon nitride, silicon oxynitride, silicon carbide, silicon oxycarbide (SiOC) or a combination thereof. Many variations and/or modifications can be made to embodiments of the disclosure. In some other embodiments, the capping layer 240 is not formed.

In some embodiments, the capping layer 240 adjoins the salicide layer 230 and the gate spacers 150, as shown in FIGS. 2J and 3J. In some embodiments, the S/D structure 170*a* is separated from the capping layer 240 by the salicide layer 230, as shown in FIG. 3J.

Figure 3K:
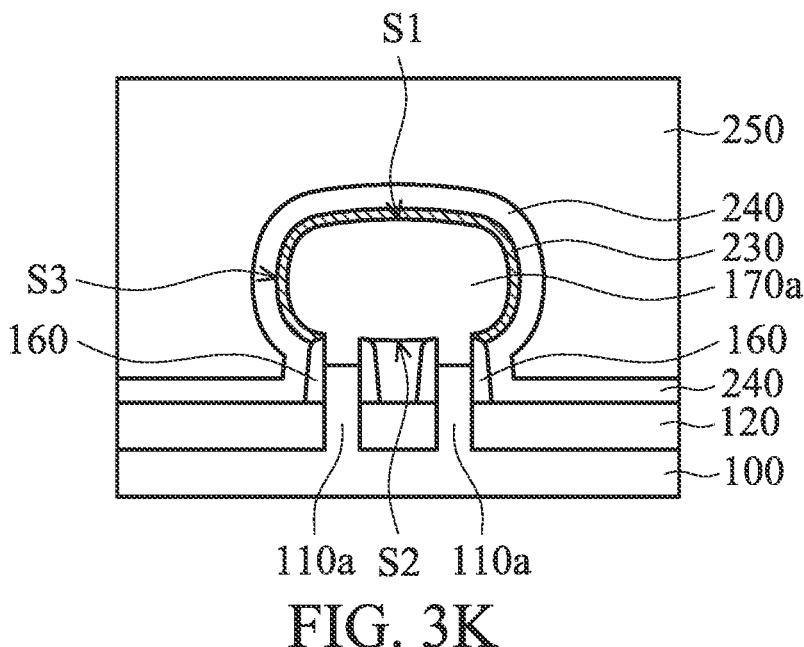

As shown in FIGS. 2K and 3K, after the capping layer 240 is deposited, a first dielectric layer 250 is deposited, in accordance with some embodiments. The first dielectric layer 250 surrounds and covers the S/D structure 170*a*, and is located between two of the gate structures 200.

In some embodiments, the first dielectric layer 250 includes silicon oxide, silicon oxynitride, borosilicate glass (BSG), phosphosilicate glass (PSG), borophosphosilicate glass (BPSG), fluorinated silicate glass (FSG), low-K material, porous dielectric material, another suitable dielectric material, or a combination thereof. The material of the first dielectric layer 250 is selected to minimize propagation delays and crosstalk between nearby conductive features. In some embodiments, the first dielectric layer 250 is deposited using a flowable CVD process, a spin-on process, an ALD process, a PVD process, another applicable process, or a combination thereof. In some embodiments, the temperature of the deposition process is lower than about 450° C. and higher than about 20° C. so that risk for damaging the silicide layer 230 may be reduced.

Afterwards, the first dielectric layer 250 may be thinned down until the gate structures 200 are exposed. As a result, the mask structures 210, some portions of the capping layer 240 over the gate structures 200 and the gate spacers 150 are removed. In some embodiments, a planarization process is performed to thin down the first dielectric layer 250. The planarization process may include a CMP process, a grinding process, an etching process or a combination thereof. In some embodiments, the etching process includes a dry etching process, a wet etching process or another applicable etching process. In some embodiments, the first dielectric layer 250 is thinned down until the gate electrode 204 of the gate structures 200 is exposed, as shown in FIG. 2K.

Figure 3L:
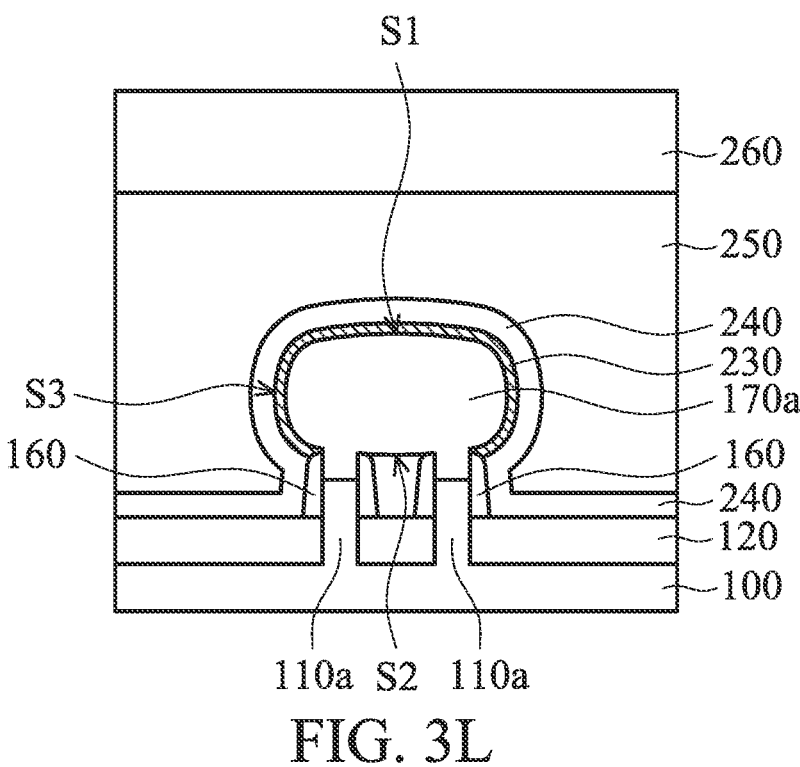

As shown in FIGS. 2L and 3L, after the first dielectric layer 250 is deposited, a second dielectric layer 260 is deposited over the first dielectric layer 250 and covers the gate structures 200, in accordance with some embodiments.

In some embodiments, the second dielectric layer 260 includes silicon oxide, silicon oxynitride, BSG, PSG, BPSG, FSG, low-K material, porous dielectric material, another suitable dielectric material, or a combination thereof. The material of the second dielectric layer 260 is selected to minimize propagation delays and crosstalk between nearby conductive features. In some embodiments, the second dielectric layer 260 is deposited by using a CVD process, a spin-on process, an ALD process, a PVD process, another applicable process, or a combination thereof.

Figure 3M:
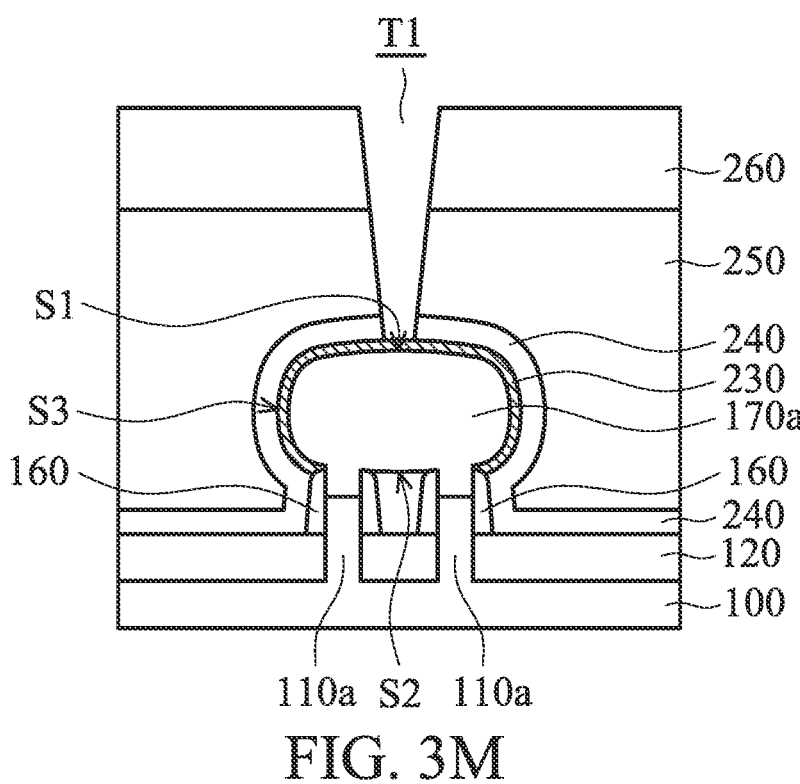

As shown in FIGS. 2M and 3M, after the second dielectric layer 260 is deposited, a trench (or openings) T1 is formed in the first dielectric layer 250 and the second dielectric layer 260, in accordance with some embodiments. The trench T1 may extend along the X-axis (shown in FIG. 1) and are arranged in a direction that is substantially parallel to the Y-axis (shown in FIG. 1). In some embodiments, the trench T1 penetrates through the first dielectric layer 250, the second dielectric layer 260 and the capping layer 240 to expose the third surface S3 of the salicide layer 230.

As shown in FIGS. 2M and 3M, the trench T1 has an inverted tapered (inverted trapezoidal) profile, in accordance with some embodiments. The inverted tapered profile has a greater width at the top than at the bottom. More specifically, the trench T1 shrinks from top to bottom. In some embodiments, the trench T1 gradually shrinks along a direction from the second dielectric layer 260 towards the first dielectric layer 250. In some embodiments, an angle between a sidewall and a bottom surface of the trench T1 is in a range from about 91 degrees to about 110 degrees. In some embodiments, the bottom surface of the trench T1 has a third width W3 which is smaller than the first width W1 and the second width W2, as shown in FIG. 2M.

In some embodiments, an etching process is used to partially remove the second dielectric layer 260, the first dielectric layer 250 and the capping layer 240 so as to form the trenches T1. The etching process may be an anisotropic etching process. In some embodiments, the etching process includes a dry etching process (such as a plasma etching process) or another applicable etching process. In some embodiments, the etchant used in the etching process contains carbon and fluorine or another suitable etching gas. For example, the etchant used in the etching process may include tetrafluoromethane ($CF_4$), fluoromethane ($CH_3F$), hexafluoro-butadiene ($C_4F_6$), or another suitable etching gas.

In some embodiments, a portion of the salicide layer 230 is etched and the S/D structure 170a are not etched during the etching process for etching the first dielectric layer 250, the second dielectric layer 260 and the capping layer 240. More specifically, during the etching of the first dielectric layer 250, the second dielectric layer 260 and the capping layer 240, the salicide layer 230 is etched and the S/D structure 170a is covered by the salicide layer 230. Since the S/D structure 170a is not etched during the etching process, the material loss of the S/D structure 170 may be prevented. Therefore, the performance of the semiconductor device structure is improved.

Figure 3N:
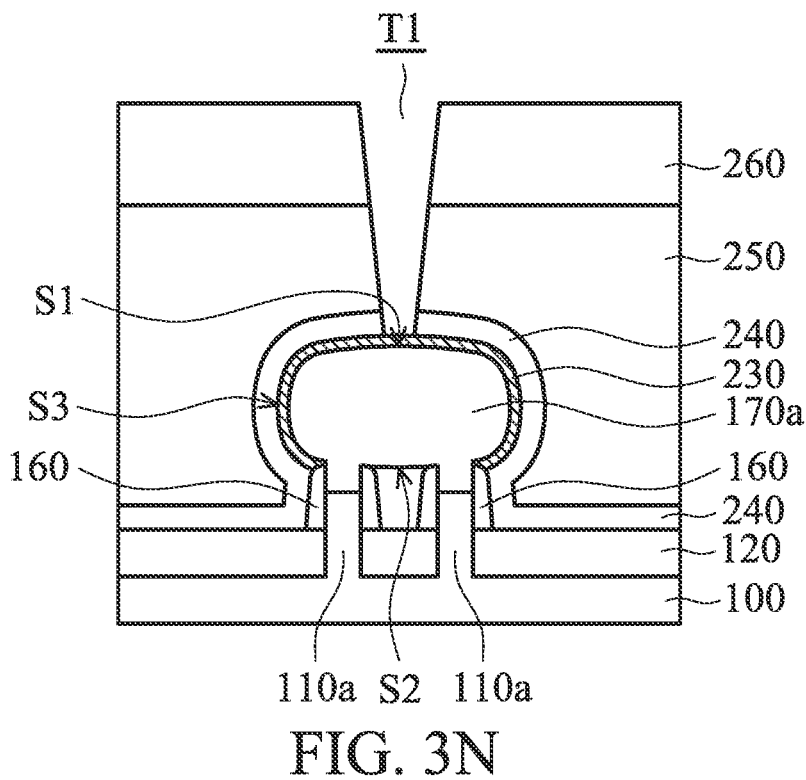
Figure 3O:
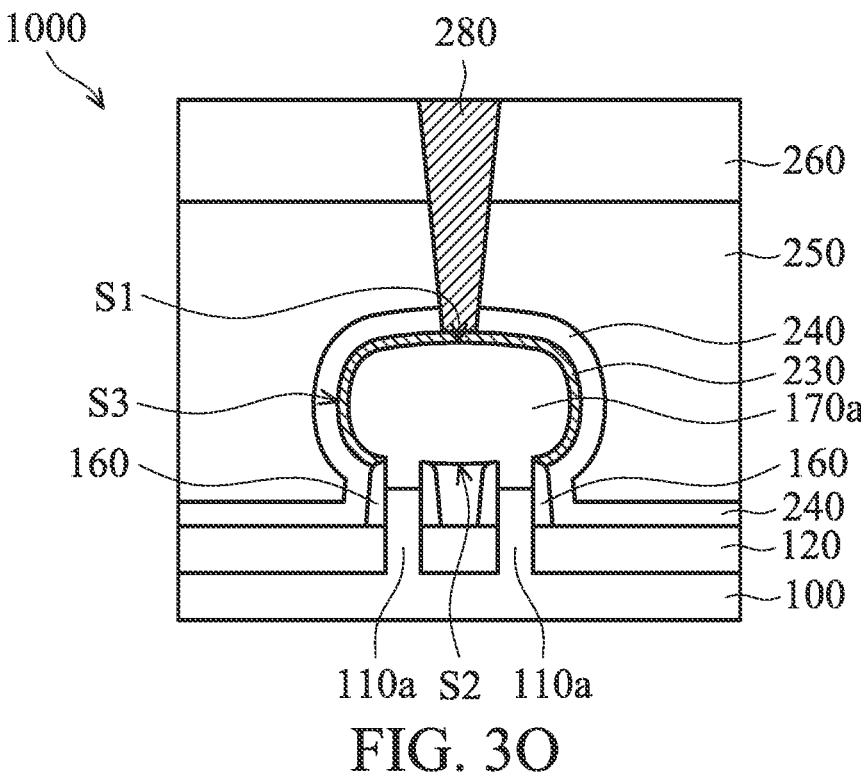

As shown in FIGS. 2N and 3N, after the trench T1 is formed, multiple trenches T2 are formed over the gate structures 200, in accordance with some embodiments. As shown in FIG. 2N, the trenches T2 penetrate through the second dielectric layer 260, and the top surfaces of the gate electrode 204 are exposed. In some embodiments, the formation methods of the trenches T2 are the same as or similar to that of trench T1. In some embodiments, the trenches T2 have an inverted tapered (inverted trapezoidal) profile, and the trenches T2 gradually shrink along a direction from the second dielectric layer 260 towards the gate structures 200.

In some other embodiments, the trenches T2 are formed after the formation of the trench T1. In some other embodiments, the trenches T2 are formed before the formation of the trench T1.

As shown in FIGS. 2N and 3N, salicide layers 270 (or silicide layers) are formed over the gate structures 200, in accordance with some embodiments. After the trenches T2 are formed, metal layers (not shown) is deposited in the trenches T2, and an anneal process is performed so that the metal layers form the salicide layers 270. In some embodiments, the material of the salicide layers 270 is the same as or similar to that of the salicide layer 230.

As shown in FIGS. 2O and 3O, a conductive material is filled into the trench T1 and trenches T2 to form contacts 280 and 290, and the semiconductor device structure 1000 is formed in accordance with some embodiments. As shown in FIG. 2O, the contact 280 is electrically connected to the S/D structure 170a, and the contacts 290 are electrically connected to the gate structures 200. In some embodiments, a conductive material layer is deposited over the second dielectric layer 260 to fill the trenches T1 and T2. A planarization process is subsequently used to remove portions of the conductive material layer outside of the trenches T1 and T2. As a result, the remaining portions of the conductive material layer in the trenches T1 and T2 form the contacts 280 and 290, respectively. In some embodiments, the contact 280 adjoins the salicide layer 230. In some embodiments, the contact 280 is separated from the gate spacers 150 by the first dielectric layer 250.

In some embodiments, the conductive material layer is made of tungsten, aluminum, copper, gold, platinum, titanium, another suitable material, or a combination thereof. In some embodiments, the conductive material layer is deposited using a CVD process, a PVD process, an electroplating process, an electroless plating process, another applicable process, or a combination thereof.

In some embodiments, the bottom surface of the contact 280 has a width W3 which is smaller than the first width W1 and the second width W2, as shown in FIG. 2O. In some embodiments, a portion of the third surface S3 of the salicide layer 230 is not direct contact with the contact 280 but with the capping layer 240. In some embodiments, a portion of the salicide layer 230 is located between the contact 280 and the S/D structure 170a, and another portion of the salicide layer 230 is located between the capping layer 240 and the S/D structure 170a, as shown in FIG. 2O. In some embodiments, a portion of the capping layer 240 is located between the silicide layer 230 and the first dielectric layer 250, as shown in FIG. 2O. In some embodiments, the salicide layer 230 has a first portion in direct contact with the contact 280 and a second portion covering the sidewall of the S/D structure 170a without overlapping with the contact 280, as shown in FIG. 3O.

In some other embodiments, the contacts 280 and 290 are formed in separate processes. For example, the contact 280 may be formed before or after the formation of the contacts 290.

Figure 4:
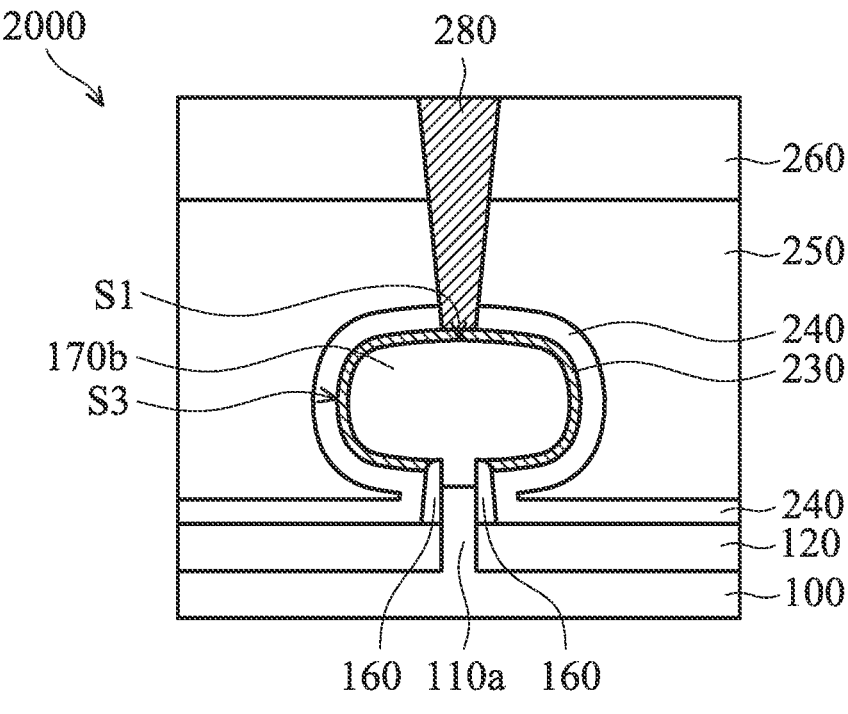
FIG. 4 is a cross-sectional view of a semiconductor device structure, in accordance with some embodiments.

FIG. 4 is a cross-sectional representation of a semiconductor device structure 2000 in accordance with some embodiments. The semiconductor device structure 2000 may be similar to, or the same as, the semiconductor device structure 1000 described above, except a S/D structure 170b is formed over one fin structure 110a.

In some embodiments, the salicide layer 230 extends from one side of the fin structure 110a to the other side of the same fin structure 110a, as shown in FIG. 4. More specifically, the salicide layer 230 covers completely or wraps around the first surface S1 of the S/D structure 170b, as shown in FIG. 4.

Figure 5:
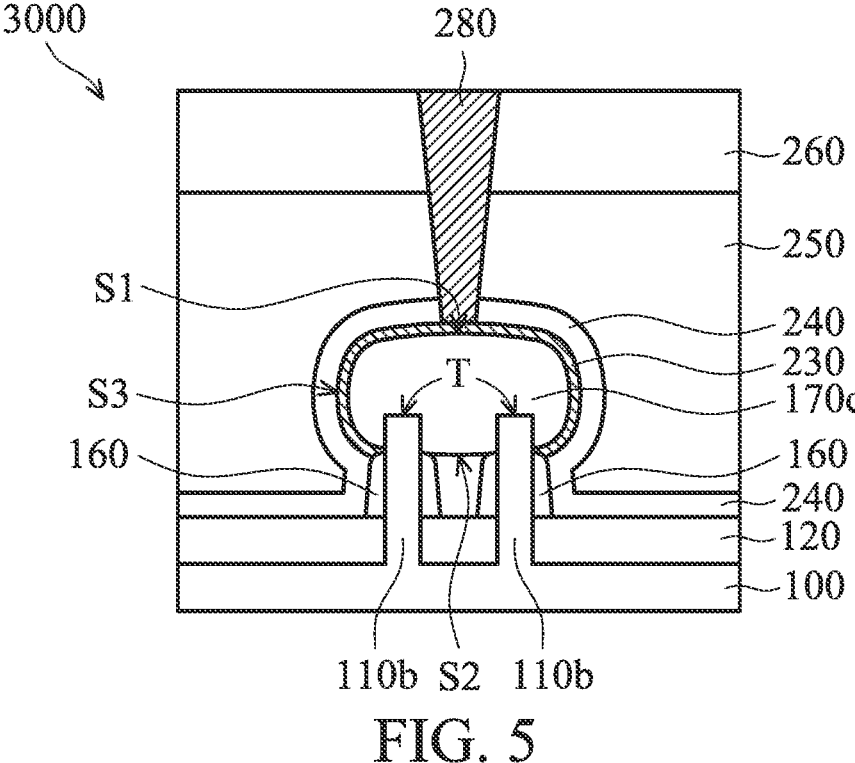
FIG. 5 is a cross-sectional view of a semiconductor device structure, in accordance with some embodiments.

FIG. 5 is a cross-sectional representation of a semiconductor device structure 3000 in accordance with some embodiments. The semiconductor device structure 3000 may be similar to, or the same as, the semiconductor device structure 1000 described above, except fin structures 110b are not recessed, and a portion of the fin structures 110b are embedded in a S/D structure 170c.

In some embodiments, the first surface S1 of the S/D structure 170c has a portion under the top surface T of the fin structures 110b and another portion above the top surface T of the fin structures 110b, as shown in FIG. 5. In some embodiments, a portion of the salicide layer 230 is lower than the top surface T of the fin structures 110b, and another portion of the salicide layer 230 is higher than the top surface T of the fin structures 110b, as shown in FIG. 5.

Embodiments of the disclosure form a semiconductor device structure with a salicide layer which has greater area for electrically connecting to the contact. Since the S/D structure is not etched during the formation of the salicide layer, damage to the profile of the S/D structure due to the loss of the S/D structure is prevented. Therefore, the resistance and the value of gain of the semiconductor device structure are improved.

Embodiments of the disclosure can be applied to not only a semiconductor device structure with N-type or P-type transistors but also a semiconductor device structure with complementary transistors or other suitable devices. Embodiments of the disclosure are not limited and may be applied to fabrication processes for any suitable technology generation. Various technology generations include a 16 nm node, a 10 nm node, a 7 nm node, or another suitable node.

In accordance with some embodiments, a semiconductor device structure is provided. The semiconductor device structure includes a fin structure over the substrate, a fin spacer alongside the fin structure, a source/drain structure over the fin structure, and a salicide layer along a surface of the source/drain structure. A bottom portion of the salicide layer is in contact with the fin spacer. The semiconductor device structure also includes a capping layer over the salicide layer. A portion of the capping layer directly below the bottom portion of the salicide layer is in contact with the fin spacer. The semiconductor device structure also includes a dielectric layer over the capping layer. The dielectric layer is made of a different material than the capping layer.

In accordance with some embodiments, a semiconductor device structure is provided. The semiconductor device structure includes a fin structure over the substrate, fin spacers surrounding an upper portion of the fin structure, and a source/drain structure over the fin structure. The source/drain structure includes a bottom portion surrounded by the fin spacers and an upper portion protruding over the fin spacers and wider than the bottom portion. The semiconductor device structure also includes a salicide layer over the source/drain structure. A bottom portion of the salicide layer extends below the upper portion of the source/drain structure. The semiconductor device structure also includes a capping layer over the salicide layer. A portion of the capping layer directly below the bottom portion of the salicide layer is in contact with a sidewall of one of the fin spacers.

In accordance with some embodiments, a semiconductor device structure is provided. The semiconductor device structure includes a fin structure over the substrate. The semiconductor device structure also includes a first gate structure and a second gate structure over the fin structure. The semiconductor device structure further includes a first gate spacer and a second gate spacer over sidewalls of the first gate structure and the second gate structure, respectively. In addition, the semiconductor device structure includes a source/drain structure over the substrate, and between the first gate structure and the second gate structure. The semiconductor device structure also includes a salicide layer over the source/drain structure. The salicide layer extends from the first gate spacer to the second gate spacer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
a first fin structure and a second fin structure over a substrate;
a first fin spacer and a second fin spacer alongside the first fin structure;
a third fin spacer and a fourth fin spacer alongside the second fin structure;
a source/drain structure over the first fin structure and the second fin structure, wherein the source/drain structure has a first surface extending outwardly from a side of the first fin spacer to a side of the fourth fin spacer, and a second surface extending from a side of the second fin spacer to a side of the third fin spacer;

a salicide layer over the source/drain structure, wherein a bottom portion of the salicide layer is in contact with the first fin spacer, the first surface of the source/drain structure is entirely interfaced with the salicide layer, and the second surface of the source/drain structure is isolated from the salicide layer;
a capping layer over the salicide layer, wherein a portion of the capping layer directly below the bottom portion of the salicide layer is in contact with the fin spacer; and
a dielectric layer over the capping layer, wherein the dielectric layer is made of a different material than the capping layer.

2. The semiconductor device structure as claimed in claim 1, wherein the source/drain structure includes a bottom portion lower than a top of the first fin spacer and an upper portion higher than a top of the first fin spacer and wider than the bottom portion.

3. The semiconductor device structure as claimed in claim 2, wherein the bottom portion of the salicide layer extends below the upper portion of the source/drain structure.

4. The semiconductor device structure as claimed in claim 1, wherein the source/drain structure surrounds an upper portion of the first fin structure.

5. The semiconductor device structure as claimed in claim 1, further comprising:
a contact passing through the dielectric layer and the capping layer and landing on the salicide layer.

6. The semiconductor device structure as claimed in claim 1, further comprising:
an isolation feature surrounding a lower portion of the first fin structure, wherein the first fin spacer is located on the isolation feature.

7. A semiconductor device structure, comprising:
a first fin structure and a second fin structure over a substrate;
first and second fin spacers surrounding an upper portion of the first fin structure;
third and fourth fin spacers surrounding an upper portion of the second fin structure;
a source/drain structure over the first fin structure and the second fin structure, wherein the source/drain structure includes a bottom portion surrounded by the first and second fin spacers and an upper portion protruding over the first and second fin spacers;
a salicide layer over the source/drain structure, wherein a bottom portion of the salicide layer extends below the upper portion of the source/drain structure, wherein an interface between the source/drain structure and the first fin structure is positioned at a level between a bottom of the salicide layer in contact with the sidewall of the first fin spacer and a bottom surface of the first fin spacer; and
a capping layer over the salicide layer, wherein a portion of the capping layer is located directly below the bottom portion of the salicide layer is in contact with a sidewall of one of the fin spacers,
wherein the source/drain structure has a first surface extending outwardly from a side of the first fin spacer to a side of the fourth fin spacer, and a second surface extending from a side of the second fin spacer to a side of the third fin spacer, the first surface of the source/drain feature is separated from the capping layer by the salicide layer, and the second surface of the source/drain feature is separated from the salicide layer.

8. The semiconductor device structure as claimed in claim 7, further comprising:

a dielectric layer over the capping layer, wherein the dielectric layer is made of a different material than the capping layer.

9. The semiconductor device structure as claimed in claim 8, further comprising:

a contact in the dielectric layer and the capping layer and on the salicide layer.

10. The semiconductor device structure as claimed in claim 9, wherein the first fin structure extends in a first direction, the salicide layer has a first width in the first direction, the contact has a second width in the first direction, and the second width is less than the first width.

11. The semiconductor device structure as claimed in claim 10, wherein the source/drain structure has a third width in the first direction, and the third width is substantially the same as the first width.

12. The semiconductor device structure as claimed in claim 7, further comprising:

an isolation feature over a substrate, wherein a lower portion of the first fin structure is embedded in the isolation feature.

13. The semiconductor device structure as claimed in claim 7, further comprising:

a first gate structure and a second gate structure across the first fin structure;

a first gate spacer alongside the first gate structure; and a second gate spacer alongside the second gate structure, wherein the salicide layer extends between and is in contact with the first gate spacer and the second gate spacer.

14. A semiconductor device structure, comprising:

a first fin structure and a second fin structure over a substrate;

a first fin spacer and a second fin spacer alongside the first fin structure;

a third fin spacer and a fourth fin spacer alongside the second fin structure;

a first gate structure and a second gate structure over the first fin structure;

a first gate spacer over a sidewall of the first gate structure;

a second gate spacer over a sidewall of the second gate structure;

a source/drain structure over the substrate and between the first gate structure and the second gate structure; and a salicide layer over the source/drain structure, wherein the salicide layer extends from the first gate spacer to the second gate spacer, wherein an interface between the source/drain structure and the first fin structure is located lower than a bottom of the salicide layer and higher than a bottom surface of the first fin spacer, wherein the source/drain structure has a first surface extending outwardly from a first side of the first fin spacer to a second side of the fourth fin spacer, and a second surface extending from a third side of the second fin spacer to a fourth side of the third fin spacer, the salicide layer extends continuously, from the first side to the second side, along the first surface of the source/drain feature, and the second surface of the source/drain feature is isolated from the salicide layer.

15. The semiconductor device structure as claimed in claim 14, further comprising:

a contact over a first portion of the salicide layer.

16. The semiconductor device structure as claimed in claim 15, wherein a second portion of the salicide layer covers a sidewall of the source/drain structure without overlapping with the contact.

17. The semiconductor device structure as claimed in claim 14, further comprising:

a dielectric layer over the salicide layer, and between the first gate structure and the second gate structure;

a contact over the salicide layer, wherein the contact and the first gate spacer are separated by the dielectric layer.

18. The semiconductor device structure as claimed in claim 17, wherein the salicide layer has a first width, and the contact has a bottom surface which has a second width smaller than the first width.

19. The semiconductor device structure as claimed in claim 17, wherein the salicide layer is in direct contact with the first gate spacer and the second gate spacer.

20. The semiconductor device structure as claimed in claim 17, wherein in a cross-sectional view, a first portion of the salicide layer extends upwards from the first gate spacer layer to the contact.

* * * * *